(12) United States Patent
Fukuda

(10) Patent No.: US 8,082,536 B2
(45) Date of Patent: Dec. 20, 2011

(54) SEMICONDUCTOR INTEGRATED CIRCUIT MANUFACTURING PROCESS EVALUATION METHOD

(75) Inventor: Daisuke Fukuda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 344 days.

(21) Appl. No.: 12/407,987

(22) Filed: Mar. 20, 2009

(65) Prior Publication Data

US 2009/0246893 A1    Oct. 1, 2009

(30) Foreign Application Priority Data

Mar. 28, 2008    (JP) .................................. 2008-088394

(51) Int. Cl.
- G06F 17/50    (2006.01)
- G06F 11/22    (2006.01)
- G06F 19/00    (2006.01)
- H01L 21/66    (2006.01)

(52) U.S. Cl. ........................... 716/136; 438/16; 700/121

(58) Field of Classification Search .................. 716/136; 438/16; 700/121
See application file for complete search history.

(56) References Cited

U.S. PATENT DOCUMENTS

| | | | |
|---|---|---|---|
| 6,905,967 B1 * | 6/2005 | Tian et al. | 438/697 |
| 7,785,983 B2 * | 8/2010 | Zia et al. | 438/427 |
| 2004/0043560 A1 * | 3/2004 | Popp | 438/243 |

FOREIGN PATENT DOCUMENTS

JP    2003-224098    8/2003

* cited by examiner

Primary Examiner — Stacy Whitmore
Assistant Examiner — Magid Dimyan
(74) Attorney, Agent, or Firm — Greer, Burns & Crain, Ltd.

(57) ABSTRACT

A method for evaluating a process of manufacturing a semiconductor integrated circuit including a deposition step and a polishing step after the deposition step, the method includes: dividing the semiconductor integrated circuit into a plurality of areas; determining a deposition height after the deposition step for each of the areas; and determining a risk value for each of the areas on the basis of a difference in the deposition height between each of the areas and its adjacent areas.

6 Claims, 11 Drawing Sheets

DESIRABLE EXAMPLE   DISADVANTAGEOUS EXAMPLE

FIG. 8

DITRIBUTION OF ECP HEIGHTS

| -80 | -80 | -80 | -80 | -80 |
|---|---|---|---|---|
| -80 | -50 | -50 | -50 | -80 |
| -80 | -50 | +100 | -50 | -80 |
| -80 | -50 | -50 | -50 | -80 |
| -80 | -80 | -80 | -80 | -80 |

FIG. 9

| LAY | X | Y | DENS | EDGE | ECP | F1 | F2 |
|---|---|---|---|---|---|---|---|
| 1 | 0 | 0 | 0.84 | 186000 | 970 | 138 | 138 |
| 1 | 0 | 1 | 0.77 | 123000 | 940 | 109 | 109 |
| ... | | | | | | | |
| 7 | 849 | 849 | 0.39 | 83300 | 870 | -130 | -210 |

(5,057,500 LINES)

FIG. 12

| Lay | x | y | dens | edge | Darea | Ddens | Dedge | ecp | F1 | F2 | best | Bdens | Bedge |
|---|---|---|---|---|---|---|---|---|---|---|---|---|---|
| 1 | 0 | 0 | 42.3 | 186 | 28.8 | 14.4 | 200 | 970 | 13 | 138 | 138 | 14.4 | 200 |
| 1 | 0 | 1 | 37.8 | 123 | 42.2 | 16.3 | 219 | 940 | 118 | 118 | 118 | 16.3 | 219 |
| ... | | | | | | | | | | | | | |
| 7 | 849 | 849 | 17.8 | 52 | 70.0 | 34.2 | 418 | 860 | -140 | -220 | -50 | 38.2 | 620 |

(5,057,500 LINES)

FIG. 13

EXTRACT DATA FROM GDS AFTER LAYOUT

| Lay | x | y | dens | edge | Darea | Ddens | Dedge | ecp | F1 | F2 | best | Bdens | Bedge |
|---|---|---|---|---|---|---|---|---|---|---|---|---|---|
| 1 | 0 | 0 | 42.3 | 186 | 28.8 | 14.4 | 200 | — | — | — | — | — | — |
| 1 | 0 | 1 | 37.8 | 123 | 42.2 | 16.3 | 219 | — | — | — | — | — | — |
| ... | | | | | | | | | | | | | |
| 7 | 500 | 234 | 17.8 | 52 | 70.0 | 34.2 | 418 | — | — | — | — | — | — |
| 7 | 500 | 235 | 29.8 | 119 | 42.2 | 25.2 | 290 | — | — | — | — | — | — |
| ... | | | | | | | | | | | | | |

FIG. 14

ECP SIMULATION, RISK CHECK

| Lay | x | y | dens | edge | Darea | Ddens | Dedge | ecp | F1 | F2 | best | Bdens | Bedge |
|---|---|---|---|---|---|---|---|---|---|---|---|---|---|
| 1 | 0 | 0 | 42.3 | 186 | 28.8 | 14.4 | 200 | 970 | 138 | 138 | — | — | — |
| 1 | 0 | 1 | 37.8 | 123 | 42.2 | 16.3 | 219 | 940 | 118 | 118 | — | — | — |
| ... | | | | | | | | | | | | | |
| 7 | 500 | 234 | 17.8 | 52 | 70.0 | 34.2 | 418 | — | — | — | — | — | — |
| 7 | 500 | 235 | 29.8 | 119 | 42.2 | 25.2 | 290 | — | — | — | — | — | — |
| ... | | | | | | | | | | | | | |

FIG. 15

UPDATE

| Lay | x | y | dens | edge | Darea | Ddens | Dedge | ecp | F1 | F2 | best | Bdens | Bedge |
|---|---|---|---|---|---|---|---|---|---|---|---|---|---|
| 1 | 0 | 0 | 42.3 | 186 | 28.8 | 14.4 | 200 | 970 | 138 | 138 | — | — | — |
| 1 | 0 | 1 | 37.8 | 123 | 42.2 | 16.3 | 219 | 940 | 118 | 118 | — | — | — |
| ... | | | | | | | | | | | | | |
| 7 | 500 | 234 | 17.8 | 52 | 70.0 | 40.0 | 250 | 830 | −50 | +30 | +30 | 40 | 250 |
| 7 | 500 | 235 | 29.8 | 119 | 42.2 | 25.2 | 290 | 987 | +64 | +94 | — | — | — |
| ... | | | | | | | | | | | | | |

FIG. 16

DETERMINE OPTIMUM DUMMY DATA

| Lay | x | y | dens | edge | Darea | Ddens | Dedge | ecp | F1 | F2 | best | Bdens | Bedge |
|---|---|---|---|---|---|---|---|---|---|---|---|---|---|
| 1 | 0 | 0 | 42.3 | 186 | 28.8 | 14.4 | 200 | 970 | 138 | 138 | — | — | — |
| 1 | 0 | 1 | 37.8 | 123 | 42.2 | 16.3 | 219 | 940 | 118 | 118 | — | — | — |
| ... | | | | | | | | | | | | | |
| 7 | 500 | 234 | 17.8 | 52 | 70.0 | 34.2 | 400 | 1020 | +140 | +220 | +30 | 40 | 250 |
| 7 | 500 | 235 | 29.8 | 119 | 42.2 | 25.2 | 290 | 987 | +25 | +55 | — | — | — |
| ... | | | | | | | | | | | | | |

FIG. 17

UPDATE

| Lay | x | y | dens | edge | Darea | Ddens | Dedge | ecp | F1 | F2 | best | Bdens | Bedge |
|---|---|---|---|---|---|---|---|---|---|---|---|---|---|
| 1 | 0 | 0 | 42.3 | 186 | 28.8 | 14.4 | 200 | 970 | 138 | 138 | — | — | — |
| 1 | 0 | 1 | 37.8 | 123 | 42.2 | 16.3 | 219 | 940 | 118 | 118 | — | — | — |
| ... | | | | | | | | | | | | | |
| 7 | 500 | 234 | 17.8 | 52 | 70.0 | 40.0 | 250 | 830 | −50 | +30 | +30 | 40 | 250 |
| 7 | 500 | 235 | 29.8 | 119 | 42.2 | 25.2 | 290 | 987 | +64 | +94 | — | — | — |
| ... | | | | | | | | | | | | | |

SEMICONDUCTOR INTEGRATED CIRCUIT MANUFACTURING PROCESS EVALUATION METHOD

CROSS-REFERENCE TO RELATED APPLICATION

This application is based upon and claims the benefit of priority of the prior Japanese Patent Application No. 2008-088394, filed on Mar. 28, 2008 the entire contents of which are incorporated herein by reference.

FIELD

The embodiment discussed herein is related to a technique for evaluating a process of manufacturing a semiconductor integrated circuit.

BACKGROUND

In the production of a semiconductor integrated circuit, a desired circuit is formed by repeating the steps of exposing, etching, depositing (plating), and polishing of a wafer to build a laminated structure. While doing this, productivity is increased by forming a plurality of semiconductor integrated circuits simultaneously on a wafer.

In particular, in recent years, a wafer diameter is increased to increase the number of circuits that can be produced at once. However, as a wafer becomes larger, it is increasingly difficult to process a wafer evenly at the central portion and peripheral portion thereof. Moreover, miniaturization of circuits is under way and highly accurate processing may be required.

For example, in copper wiring, which is widely used nowadays, ECP (Electro-Chemical Plating), in which wiring grooves are made on an insulator and then copper plating is performed on that insulator to fill in the grooves with copper, is performed. In this process, since not only the wiring grooves but also a whole surface of the insulator are copper-plated, CMP (Chemical Mechanical Polishing) is used for polishing to expose a wiring pattern.

If large height differences are created on a wafer as a result of this CMP, the height of a copper wiring line may vary, or a short circuit of wiring caused by copper that is left unpolished may occur. In either case, the performance of a semiconductor integrated circuit may degrade, or the yield rate may be decreased.

Also, in some cases, a problem does not occur with a single layer of a circuit but occurs when another layer is laminated. This kind of problem tends to occur at a portion where the height of a lower layer is smaller than that of the surrounding area and the height of an upper layer is larger than that of the surrounding area.

To date, production of a circuit is performed and, if an error occurs, the layout of the circuit is then modified. This is very inefficient in terms of cost and time, because a wafer is first made and then modified. Thus a method which simulates CMP and performs prediction and modification prior to production is proposed (see, for example, Japanese Laid-open Patent Publication No. 2003-224098).

However, if a chip is made and modification is then performed, production cost and time are increased. Also, because chips are produced without eliminating a problematic portion, the yield rate may drop by about 10%.

When a CMP simulation is used, production cost is reduced to some extent because trial production does not need to be performed. However, a CMP simulation may take a few hours or a day to complete depending on, for example, the size of the chip to be produced. To correct a problematic portion, a CMP simulation needs to be performed several times, possibly causing the total simulation time to be a few days or weeks.

That is to say, in the known art, there is a problem in that it is time-consuming to obtain a result of CMP, and a lot of time is thus needed to determine an optimum circuit layout.

The present invention has been achieved to address and overcome the above-mentioned problem of the known art, and an object of the present invention is to provide a polish prediction and evaluation apparatus, method, and program that can predict and evaluate a result of a polishing process in a short time, thereby enhancing the speed of layout modification to increase the yield rate in a short time.

SUMMARY

According to an aspect of the invention, a method for evaluating a process of manufacturing a semiconductor integrated circuit including a deposition step and a polishing step after the deposition step, the method includes: dividing the semiconductor integrated circuit into a plurality of areas; determining a deposition height after the deposition step for each of the areas; and determining a risk value for each of the areas on the basis of a difference in the deposition height between each of the areas and its adjacent areas.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 8 is a diagram illustrating examples of distribution of ECP deposition heights;

FIG. 9 is a diagram illustrating input and output data of a polish prediction and evaluation apparatus;

FIG. 12 is a diagram illustrating input and output data of the polish prediction and evaluation apparatus illustrated in FIG. 10;

FIG. 13 is a diagram illustrating input circuit layout data;

FIG. 14 is a diagram illustrating changing of data by an ECP simulation and a risk evaluation;

FIG. 15 is a diagram illustrating detection of an error portion;

FIG. 16 is a diagram illustrating generation of optimum dummy data; and

FIG. 17 is a diagram illustrating updating of data based on optimum dummy data.

DESCRIPTION OF EMBODIMENTS

Embodiments of the present invention will be explained with reference to accompanying drawings.

First Embodiment

Figure 1:
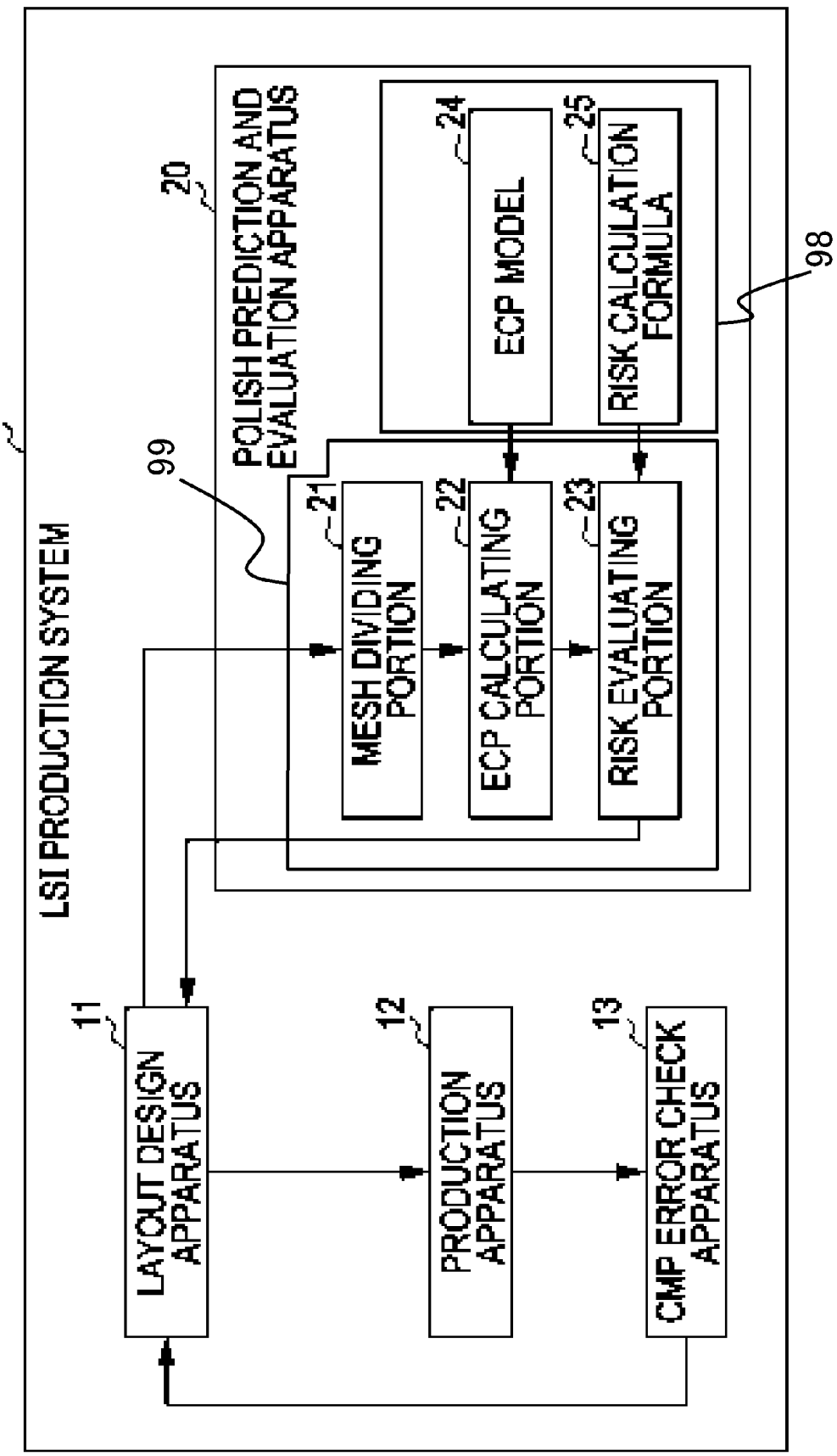
FIG. 1 is a schematic configuration diagram illustrating a schematic configuration of a LSI production system according to First Embodiment.

FIG. 1 is a schematic configuration diagram illustrating a schematic configuration of a LSI (large-scale integration) production system according to the First Embodiment. As illustrated in FIG. 1, a LSI production system 10 includes a layout design apparatus 11, a production apparatus 12, a CMP error check apparatus 13, and a polish prediction and evaluation apparatus 20.

The layout design apparatus 11 is an apparatus that designs a circuit layout of a LSI chip, and first outputs a circuit layout it designed to the polish prediction and evaluation apparatus 20. The polish prediction and evaluation apparatus 20 predicts and evaluates an execution result of CMP from the circuit layout and returns an evaluated result to the layout design apparatus 11.

The layout design apparatus 11 modifies the layout if the evaluated result returned from the polish prediction and evaluation apparatus 20 is not good enough, and once again outputs the modified layout to the polish prediction and evaluation apparatus 20. In the case that the result of prediction and evaluation is good enough, the layout design apparatus then outputs the circuit layout to the production apparatus 12.

The production apparatus 12 produces a LSI chip based on the circuit layout obtained from the layout design apparatus 11. While doing this, the production apparatus 12 evaluates a condition after actual polishing is performed on a layer (one cycle of exposing, etching, depositing (plating), and polishing) basis by the CMP error check apparatus 13, and returns the result of that evaluation to the layout design apparatus 11.

The layout design apparatus 11 incorporates the table or result returned from the CMP error apparatus 13 into the circuit layout, determines a final layout, and sends the final layout to, for example, a mass production line.

The polish prediction and evaluation apparatus 20 can evaluate a process of manufacturing a semiconductor integrated circuit. The process of manufacturing may include a deposition step and a polishing step after the deposition step.

The polish prediction and evaluation apparatus 20 has a mesh dividing module 21, an ECP calculating module 22, a risk evaluating module 23, an ECP model 24, and a risk calculation formula 25 at the interior thereof. For example, the mesh dividing module 21, the ECP calculating module 22, and the risk evaluating module 23 may be processed by a processor 99. For example, the ECP model 24, and the risk calculation formula 25 may be stored in a memory 98.

The mesh dividing module 21 divides the circuit layout received from the layout design apparatus 11 into a plurality of areas (meshes). The ECP calculating module 22 calculates a deposition height of each of the meshes after ECP is performed, using the ECP model 24. As an ECP model to obtain a deposition height after ECP is performed, a model that performs calculation based on a wiring density and a wiring boundary length is known.

The risk evaluating module 23 compares predicted values of deposition heights of meshes with predicted values of deposition heights of neighboring meshes to calculate an evaluated value for a CMP process (step), and determines a risk of CMP from the calculated result.

Figure 2:
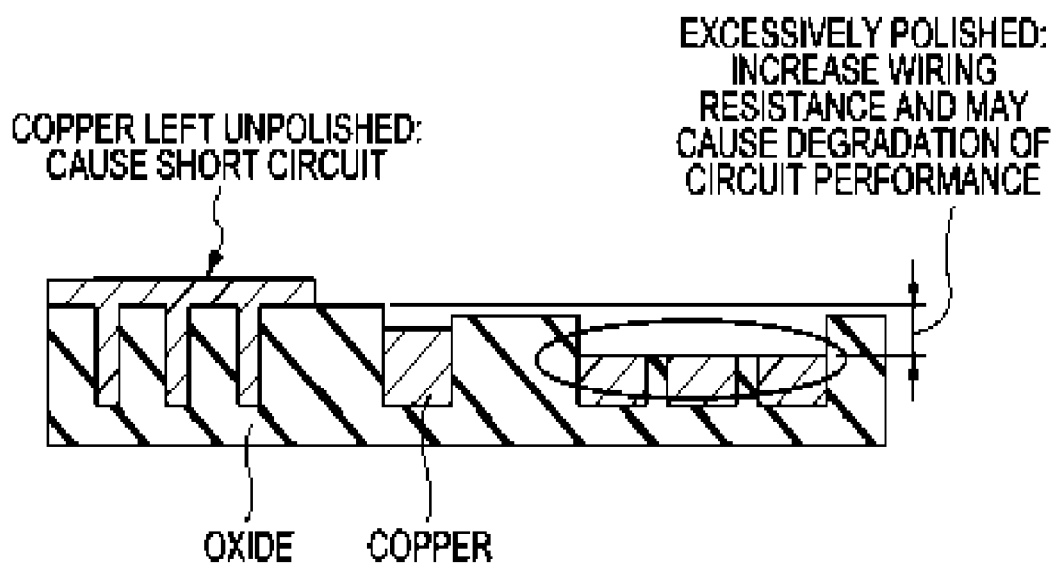
FIG. 2 is a diagram illustrating an evaluation and a risk of CMP.

This evaluation and risk of CMP will now be further described with reference to FIG. 2. In FIG. 2, concaves and convexes are generated on a surface of a wafer as a result of CMP. The convexes are generated because some of the copper which was deposited by ECP is left unpolished. The copper left unpolished on an oxide (such as silicon oxide), which can provide insulation between copper wiring lines, may cause a short circuit. The concaves are generated because the copper deposited by ECP was excessively polished. These concaves increase wiring resistance and may cause degradation of circuit performance. For example, the risk can be indicated by a value. For example, the risk value for each of the areas can be calculated on the basis of a difference in the deposition height between each of the areas and its adjacent areas.

Figure 3:
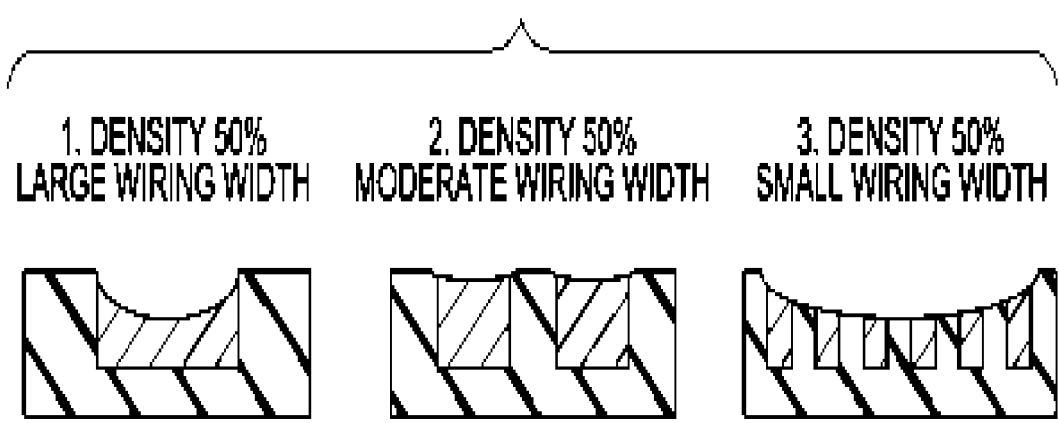
FIG. 3 is a diagram illustrating a polishing amount.

The polishing amount of CMP varies depending on wiring density as well as the width of a wiring line. As illustrated in FIG. 3, even when the wiring density is 50%, if the width of a wiring line is large, a wiring portion will be polished a lot. This is because copper is easily polished compared with an oxide. If the width of a wiring line is small, a wiring portion will also be easily polished as a whole because the width of an oxide portion is also small. In contrast, if the width of a wiring line is moderate, the polishing amount will be small because an oxide portion has sufficient width to be robust against CMP and oxide portions are spaced apart at appropriate intervals.

Thus, the polish prediction and evaluation apparatus 20 utilizes the fact that a height (deposited amount of copper) of ECP (plating) descends and affects a height after polishing by CMP, and calculates a height difference between a deposition height and a height of surrounding area as an evaluated value, or a value which evaluates a result of CMP and indicates the risk that a short circuit or circuit performance degradation will occur.

Figure 4:
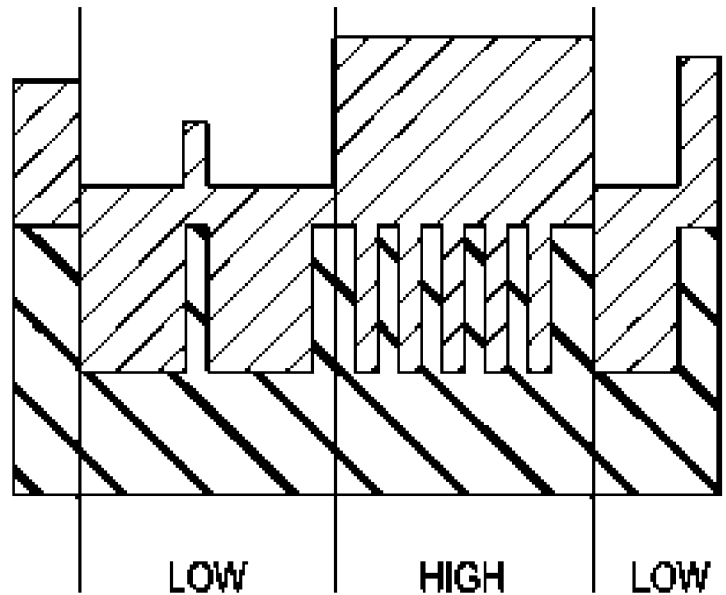
FIG. 4 is a diagram illustrating a risk evaluation based on ECP.

Specifically, as illustrated in FIG. 4, if a target area is high and the surrounding area is low, the risk is determined to be high. In the case that the deposition height of a target area is high, if the surrounding area is also high, the risk is determined to be low. Similarly, when the deposition height of a target area is low, if the surrounding area is also low, the risk is determined to be low.

Figure 5:
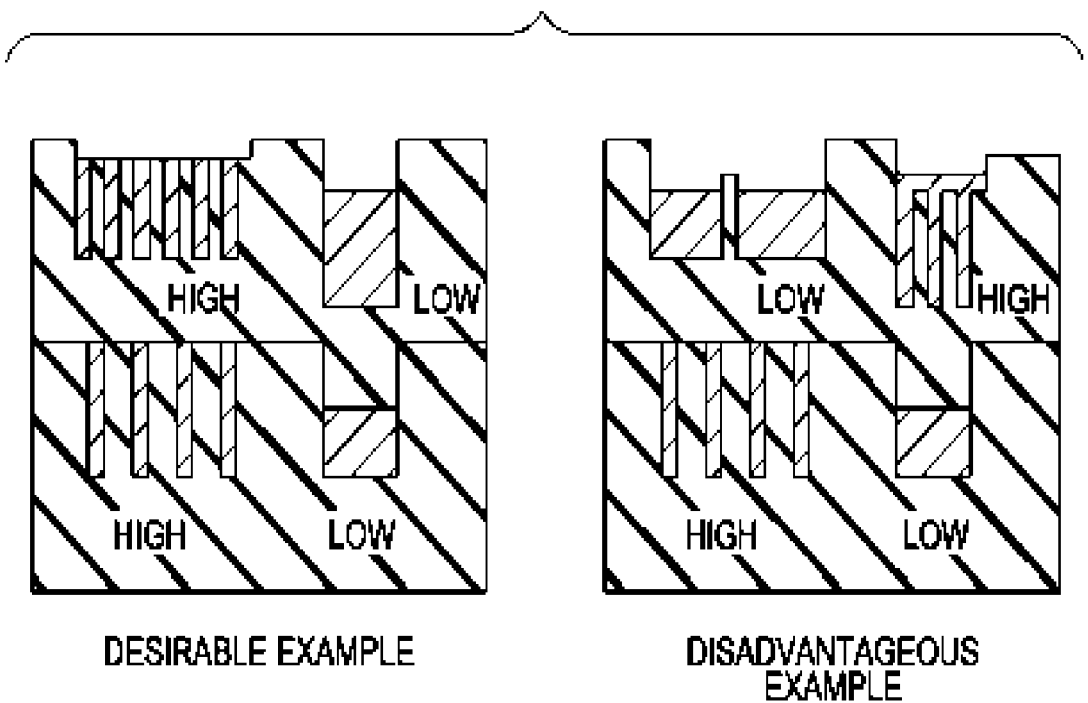
FIG. 5 is a diagram illustrating a risk evaluation which takes into account lamination.

Also, considering the fact that concaves and convexes generated after CMP are amplified by lamination, height differences of a lower layer are also evaluated. As illustrated in FIG. 5, copper tends to be left unpolished in an area where a lower layer has a small height and an upper layer has a large height, because the bottom surface of that area is lower than the surrounding area. Therefore, the possibility of a failure caused by a short circuit is increased.

Also, copper tends to be easily polished in an area where a lower layer has a large height and an upper has a small height, because the bottom surface of that area is higher than the surrounding area. Therefore, the height of a wiring line becomes smaller and the possibility of performance degradation is increased.

In contrast, in cases where both a lower layer and an upper layer have large heights, and both a lower layer and an upper layer have small heights, short circuit and performance degradation rarely occur. Thus the polish prediction and evaluation apparatus 20 compares an evaluated value of a mesh with an evaluated value of a lower layer of that mesh to obtain a multilayer evaluated value which takes into account lamination.

Figure 6:
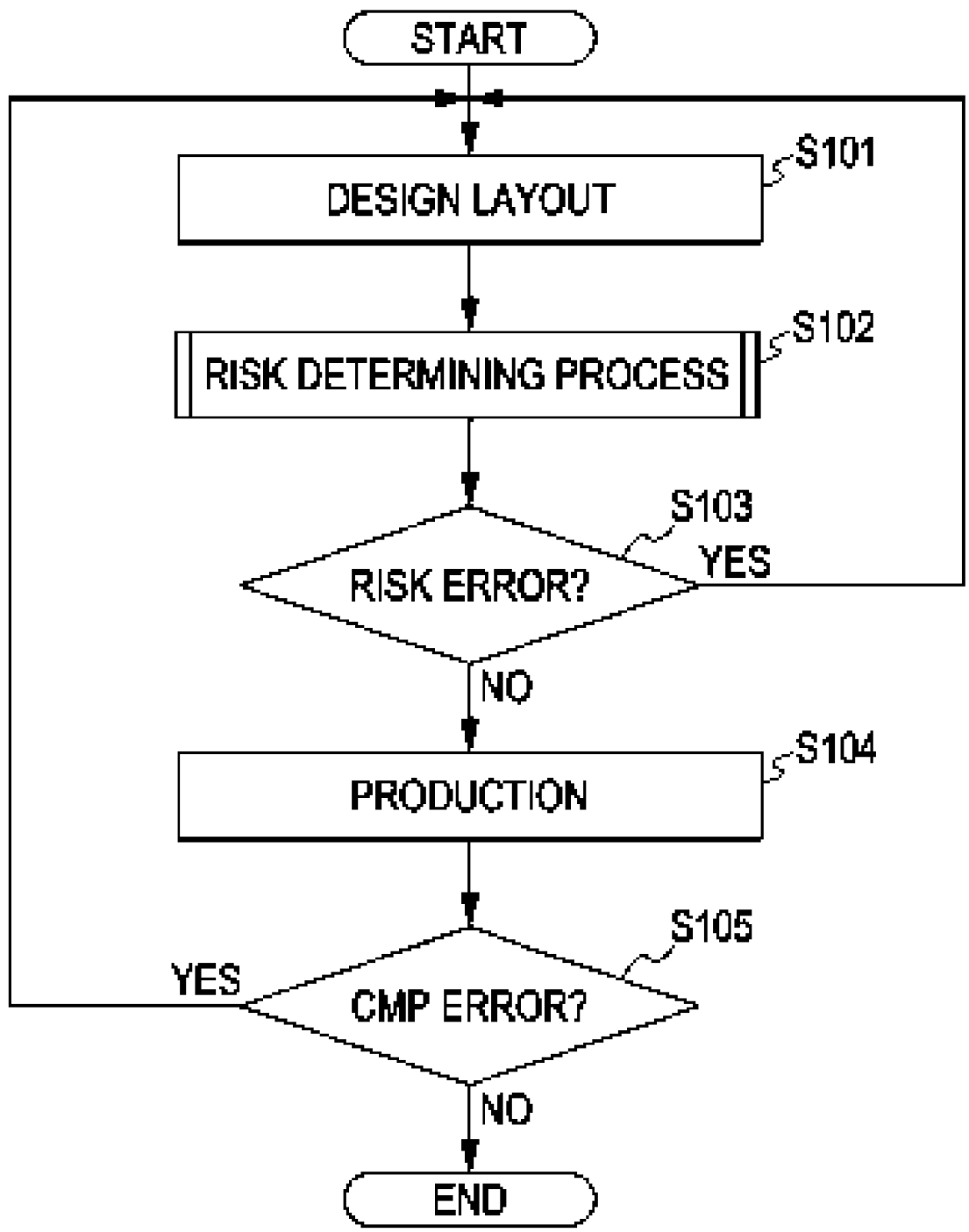
FIG. 6 is a flow chart describing a processing behavior of the LSI production system illustrated in FIG. 1.

The processing behavior of the whole LSI production system will now be described with reference to the flow chart illustrated in FIG. 6. As illustrated in FIG. 6, first of all, the layout design apparatus 11 designs a layout (step S101), and then the polish prediction and evaluation apparatus 20 performs a risk determining process (step S102).

As a result, if the risk of short circuit or performance degradation that is higher than a threshold is output, the polish prediction and evaluation apparatus 20 outputs a risk error (Yes on step S103), and the layout design apparatus 11 that received the risk error designs a layout again (step S101).

On the other hand, if the risk of short circuit or performance degradation is less than a threshold (No on step S103), the production apparatus 12 performs production (step S104), and the CMP error check apparatus 13 performs CMP error check (step S105).

As a result, if the CMP error check apparatus 13 outputs a CMP error (Yes on step S105), the layout design apparatus 11 designs a layout again (step S101). If the CMP error check apparatus 13 does not output a CMP error (No on step S105), it is assumed that an appropriate layout has been obtained and the process terminates.

Figure 7:
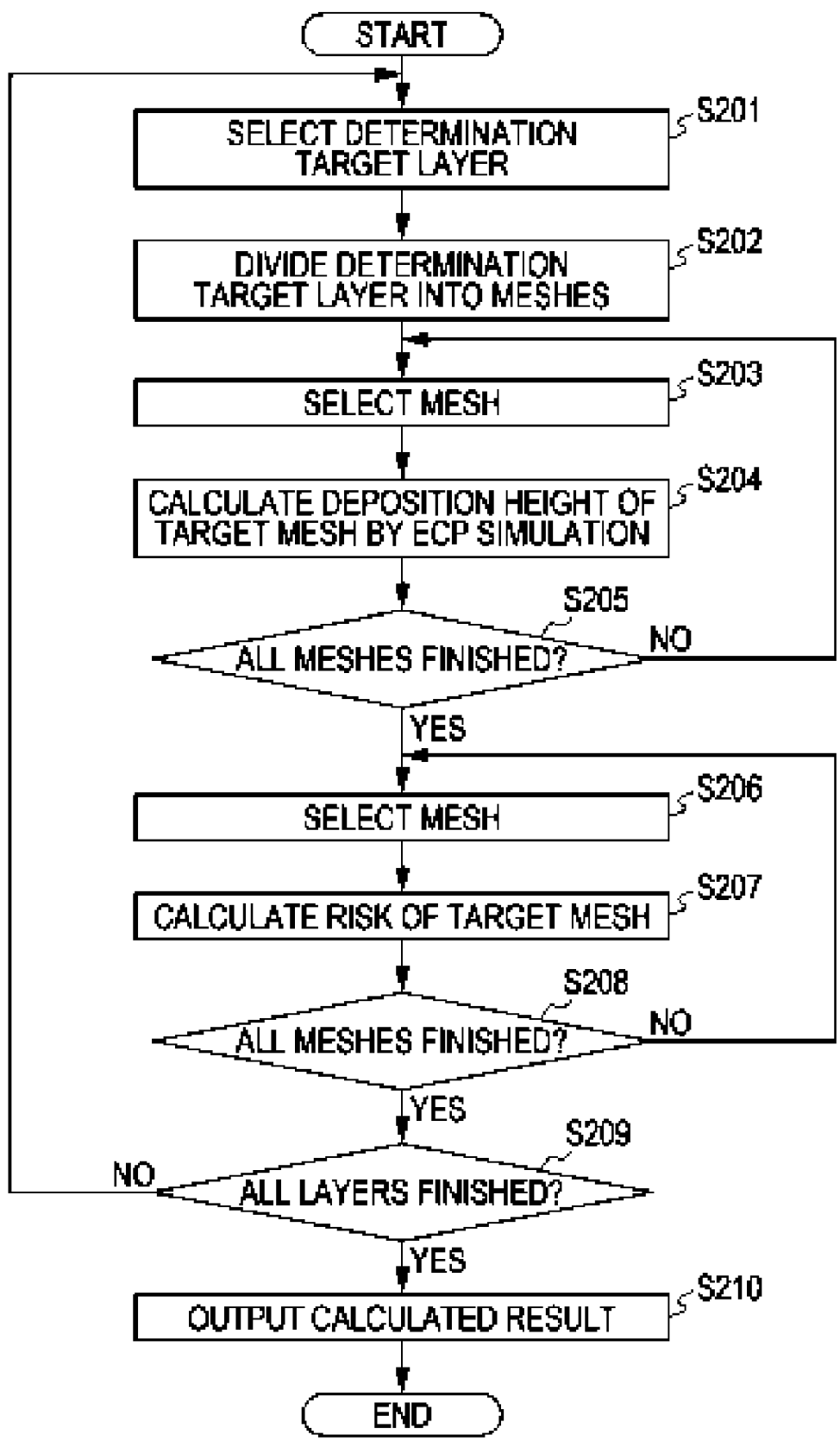
FIG. 7 is a flow chart describing in detail the risk determining process illustrated in FIG. 6.

A specific processing behavior of the risk determining process performed by the polish prediction and evaluation apparatus 20 will now be described with reference to the flow chart illustrated in FIG. 7. As illustrated in FIG. 7, the polish prediction and evaluation apparatus 20 selects a target layer for which the risk of short circuit or performance degradation is determined from the layout data output from the layout design apparatus 11 (step S201). By default, the polish prediction and evaluation apparatus 20 selects a bottom layer.

Next, the mesh dividing portion divides the target layer into meshes (step S202). The ECP calculating module 22 selects a target mesh to process (step S203), and calculates a deposition height of the target mesh by performing an ECP simulation (step S204).

The ECP calculating module 22 then determines whether calculation of a deposition height is finished or not for all the meshes (step S205) and, if it is not finished (No on step S205), goes back to the step of selecting a target mesh (step S203).

If calculation of a deposition height is finished for all the meshes (Yes on step S205), then the risk evaluating module 23 selects a target mesh to process (step S206), and calculates the risk of short circuit or performance degradation for the target mesh (step S207).

The risk evaluating module 23 then determines whether calculation of the risk of short circuit or performance degradation is finished or not for all the meshes (step S208) and, if it is not finished (No on step S208), goes back to the step of selecting a target mesh (step S206).

If calculation of the risk of short circuit or performance degradation is finished for all the meshes (Yes on step S209), it is determined whether the process is finished or not for all the layers (step S209) and, if it is not finished (No on step S209), the process goes back to the step of selecting a target layer to select the next highest layer (step S201).

If the risk of short circuit or performance degradation is determined for all the layers (Yes step S209), a calculated result is output (step S210) and the process terminates.

A specific example of a risk calculation formula will now be described. The polish prediction and evaluation apparatus 20 divides a LSI chip into meshes and identifies a mesh whose plating height is significantly higher or lower than that of the surrounding area as a portion having a high risk of short circuit or performance degradation. A variety of techniques can be applied to perform this identification, such as determining the difference between a plating height of a target mesh and an average plating height of a few surrounding meshes, or the deviation of a plating height of a target mesh among different plating heights.

Suppose that an absolute value of a difference between a deposition height of a target mesh and an average deposition height of surrounding meshes is used as a value representing the risk of short circuit or performance degradation (an evaluated value), and a "risk error" will be output if that value is higher than 200 nm. As illustrated in FIG. 8, if the deposition height of a target mesh (center) is +100, the deposition height of the meshes adjacent to the target mesh is −50, and the deposition height of the meshes surrounding the meshes adjacent to the target mesh is −80, the average deposition height of these meshes is calculated as (−50*8+−80*16+100)/25=−63.2 (nm), and the single layer risk of short circuit or performance degradation of the target mesh will be 100−(−63.3)=163.2.

Also, if the first meshes from the target mesh are weighted by 1.0 and the second meshes from the target mesh are weighted by 0.5, the weighted average deposition height of these meshes is calculated as (−50*8+(−80)*16*0.5+100)/(1+8+16*0.5)=−55.3, and the single layer risk of short circuit or performance degradation of the target mesh will be 100−(−55.2)=155.3.

Also, if an indicator of lamination is derived using the difference between the value of a target mesh and the value of a lower layer, the difference between the single layer risk of short circuit or performance degradation of a target mesh and the single layer risk of short circuit or performance degradation of a lower layer may be used. For example, if the single layer risk of short circuit or performance degradation of a target mesh is 163.3 and the single layer risk of short circuit or performance degradation of a lower layer is −70, the multilayer risk of short circuit or performance degradation will be 163.2−(−70)=233.2 (nm).

In this case, if a judging threshold of a risk error is an absolute value of 200 nm, a risk error will be output because the multilayer risk of short circuit or performance degradation is calculated as 233.2.

While the case where the single layer risk of short circuit or performance degradation of a one-level lower layer is taken into account has been described, an effect of further lower layers can be taken into account as well. In that case, each of the lower layers may be weighted. For example, a one-level lower layer may be weighted by 1.0, and a two-level lower layer may be weighted by 0.2.

FIG. 9 is a diagram illustrating a specific example of input and output data of a polish prediction and evaluation apparatus. The data illustrated in FIG. 9 includes a layer Lay, a mesh coordinate x, a mesh coordinate y, a copper density dens, a wiring boundary length edge (nm), a deposition height ecp (nm), a single layer risk of short circuit or performance degradation F1 (nm), and a multilayer risk of short circuit or performance degradation F2 (nm).

A copper density and a wiring boundary length are values using for a simulation of ECP and CMP and are obtained from layout data. A deposition height is derived from a copper density, a wiring boundary length, and an ECP model. A single layer risk of short circuit or performance degradation and a multilayer risk of short circuit or performance degradation are derived on the basis of a deposition height and the above-described risk calculation formula. The data illustrated in FIG. 9 is based on the assumption that the chip size is 8.5 cm×8.5 cm, the number of layers is 7, and the mesh size is 10 um. The final data of Lay, x, and y are 7, 849, and 849, respectively.

As described above, in the LSI production system described in the First Embodiment, the polish prediction and evaluation apparatus 20 divides a circuit layout into meshes, simulates a deposition height of each of the meshes, and determines the risk of short circuit or performance degradation from variations in ECP deposition height.

A simulation of ECP (or an indicator of ECP) can be obtained in a short time, compared to a simulation of CMP. Thus a result of CMP can be predicted/evaluated in a short time, thereby enhancing the speed of layout modification to increase the yield rate in a short time.

Specifically, layout optimization can be performed in a few minutes in total, and by detecting errors prior to production, the yield rate is expected to be increased by 10 to 20%. Also, an effect of reducing cost (a few weeks of adjustment) can be achieved.

In a check by a CMP simulation, it takes 2 hours to retrieve data from a GDS (a database that stores layout data), 8 hours for a CMP simulation, and 10 hours for each modification of a layout. On the other hand, in a risk check according to the embodiment, it takes 2 hours to retrieve data from a GDS, 10 minutes for a risk check, and 2.2 hours for each modification of a layout.

Second Embodiment

Figure 10:
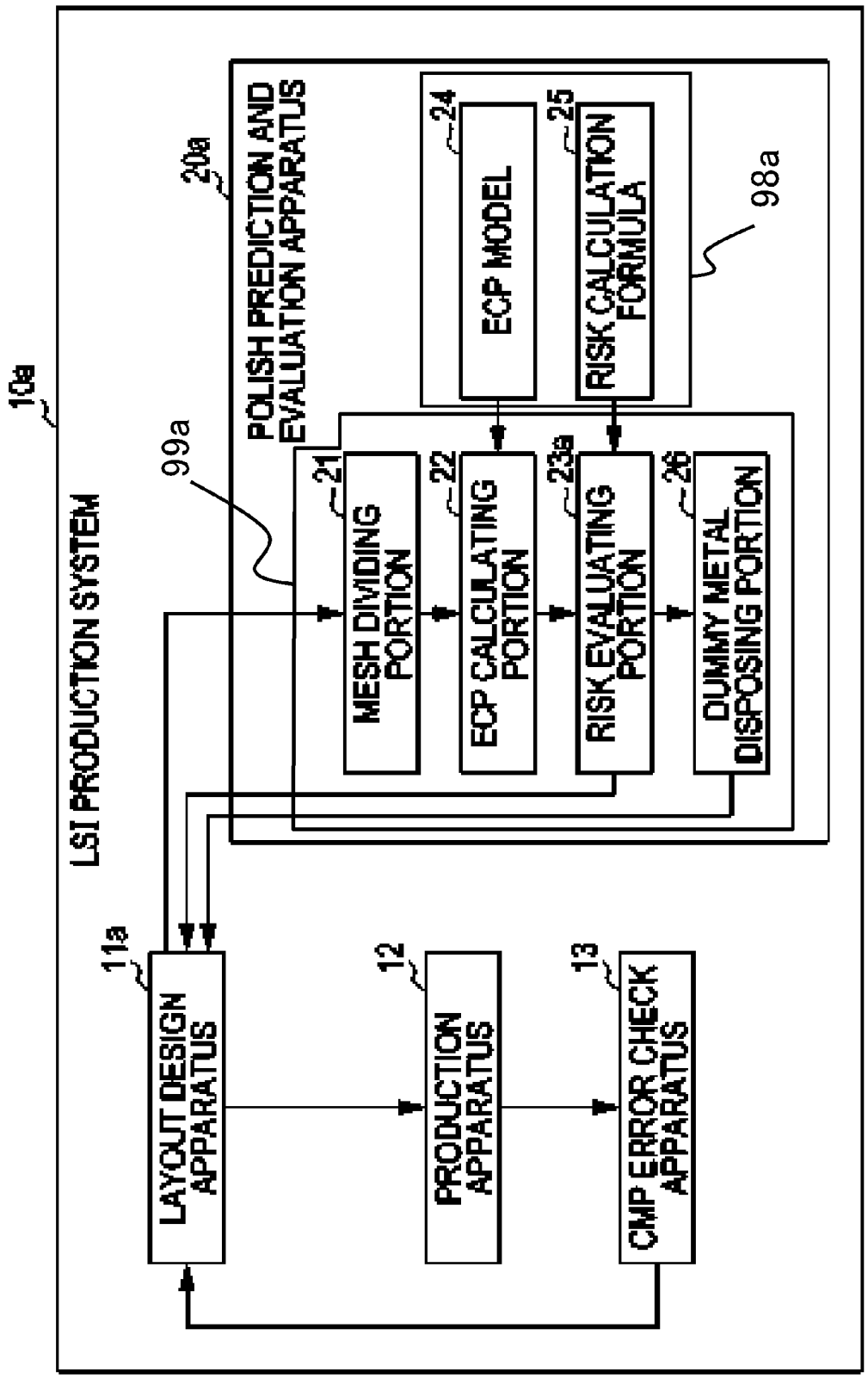
FIG. 10 is a schematic configuration diagram illustrating a schematic configuration of a LSI production system according to Second Embodiment.

FIG. 10 is a schematic configuration diagram illustrating a schematic configuration of a LSI (large-scale integration) production system according to the Second Embodiment. As illustrated in FIG. 10, a LSI production system 10a includes a layout design apparatus 11a, the production apparatus 12, the CMP error check apparatus 13, and a polish prediction and evaluation apparatus 20a. The polish prediction and evaluation apparatus 20a includes the mesh dividing module 21, the ECP calculating module 22, a risk evaluating module 23a, the ECP model 24, the risk calculation formula 25, and a dummy metal disposing module 26.

Since configurations and behaviors of these components except the layout design apparatus 11a, the polish prediction and evaluation apparatus 20a, the risk evaluating module 23a, and the dummy metal disposing module 26 are same as those of the LSI production system 10 illustrated in FIG. 1, like numerals are used to depict like components to avoid duplication of explanation. For example, the mesh dividing module 21, the ECP calculating module 22, the risk evaluating module 23a, and the dummy metal disposing module 26 may be processed by a processor 99a. For example, the ECP model 24, and the risk calculation formula 25 may be stored in a memory 98a.

The polish prediction and evaluation apparatus 20a outputs layout data which illustrates a circuit layout to the layout design apparatus 11a, putting in that layout data information about a dummy metal. The layout design apparatus 11a also receives instruction about a disposition of a dummy metal from the polish prediction and evaluation apparatus 20a to change the disposition of a dummy metal.

A specific processing behavior of a risk determining process performed by the risk evaluating module 23a and the dummy metal disposing module 26 will now be described based on the flow chart illustrated in FIG. 11. Processing details of the steps S301 to S310 illustrated in FIG. 11 are same as those of steps S201 to S210 illustrated in FIG. 7, respectively.

Figure 11:
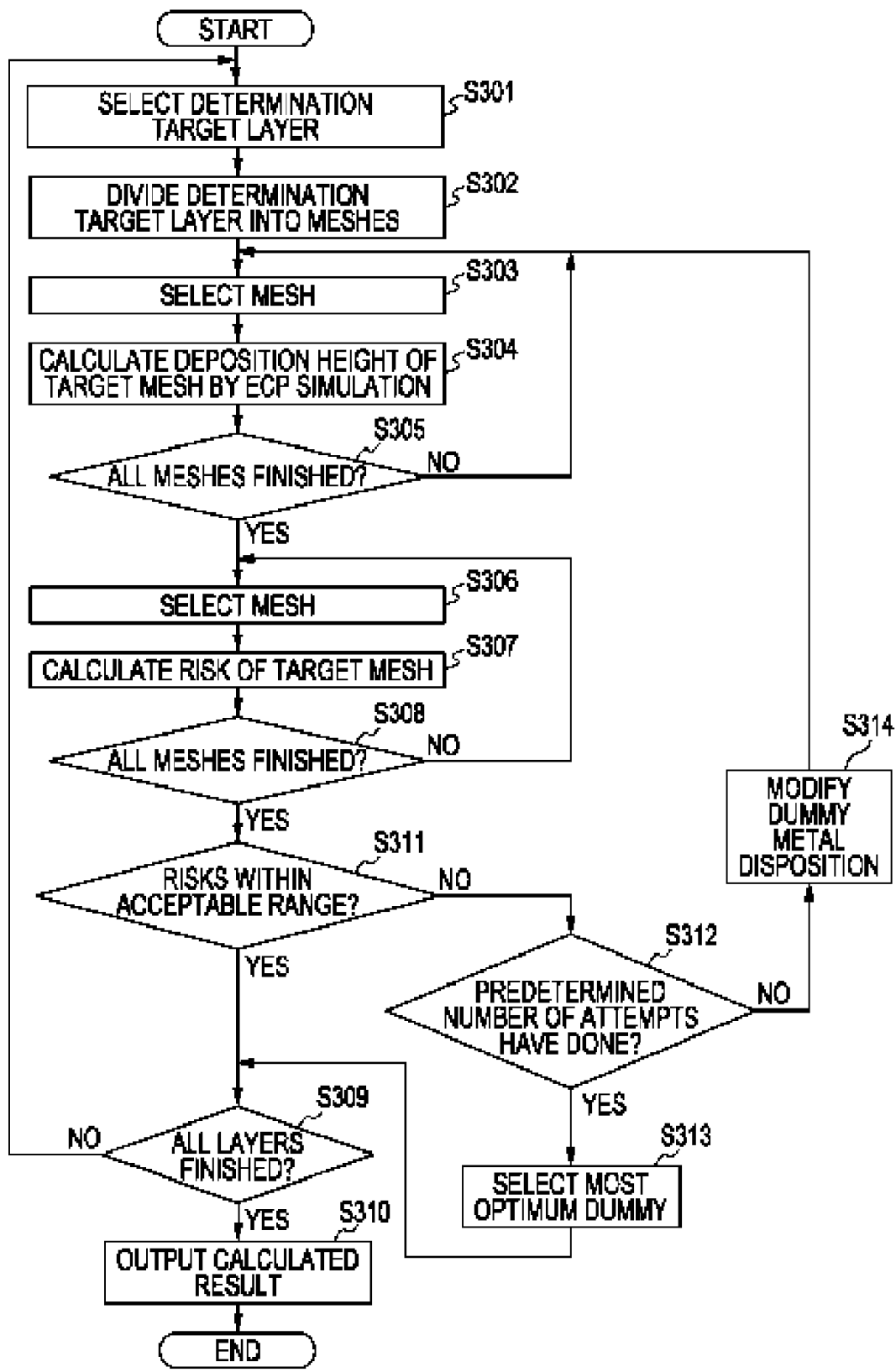
FIG. 11 is a flow chart describing a risk determining process performed by the polish prediction and evaluation apparatus illustrated in FIG. 10.

In the processing behavior illustrated in FIG. 11, if calculation of the risk of short circuit or performance degradation is finished for all the meshes of a layer (Yes on step S308), it is determined whether the risks of short circuit or performance degradation of all the meshes of that layer are within an acceptable range (less than or equal to a threshold) or not (step S311).

If the risks of short circuit or performance degradation of all the meshes are within the acceptable range (Yes on step S311), the process goes to step S309. If there is a mesh whose risk of short circuit or performance degradation is out of the acceptable range (No on step S311), the disposition of a dummy metal is modified by the dummy metal disposing module 26.

The dummy metal disposing module 26 first determines whether a predetermined number of modifications have been made to the disposition of a dummy metal on a same layer (step S312), and if a predetermined number of dispositions of a dummy metal have been done, selects the most optimum disposition of a dummy metal of all the dispositions that have been attempted. The process then goes to step S309.

On the other hand, if the number of modifications that have been attempted to the disposition of a dummy metal is less than a specified number (No on step S312), the disposition of a dummy metal is modified (step S314). The process then goes back to the step of selecting a mesh (step S303), and an ECP simulation is performed again.

As a result, the disposition of a dummy metal with which the risks of short circuit or performance degradation are within an acceptable range, or the disposition of a dummy metal which is the most optimum of all the dispositions that have been attempted within a predetermined number of times, can be obtained. In this process, since the risks of short circuit or performance degradation of lower layers are taken into account, the disposition of a dummy metal can be optimized after taking into account an effect of lamination.

For example, if the single layer risk of short circuit or performance degradation of a mesh is 163.2, the single layer risk of short circuit or performance degradation of a lower layer is −70, and the judging threshold of a risk error is an absolute value of 200, the multilayer risk of short circuit or performance degradation will be 233.2, which is higher than the threshold. In this example, by modifying the position of a dummy metal and decreasing the single layer risk of short circuit or performance degradation of the target mesh by more than 33.2, outputting of a risk error can be avoided.

FIG. 12 is a diagram illustrating input and output data of the polish prediction and evaluation apparatus 20a. The data illustrated in FIG. 12 includes a layer Lay, a mesh coordinate x, a mesh coordinate y, a copper density dens, a wiring boundary length edge (nm), a deposition height ecp (nm), a single layer risk of short circuit or performance degradation F1 (nm), and a multilayer risk of short circuit or performance degradation F2 (nm), as well as a dummy insertable area Darea, a dummy copper density Ddens, a dummy wiring boundary length Dedge (nm), the best multilayer risk of short circuit or performance degradation best, and a dummy copper density Bdens and a dummy wiring boundary length Bedge with which the best multilayer risk of short circuit or performance degradation is obtained.

Creation of this data will now be described with reference to FIGS. 13 to 17. FIG. 13 illustrates data obtained from the data that was created by the layout design apparatus 11a. This data only has values of a layer Lay, a mesh coordinate x, a mesh coordinate y, a copper density dens, a wiring boundary length edge (nm), a dummy insertable area Darea, a dummy copper density Ddens, and a dummy wiring boundary length Dedge (nm).

The ECP calculating module 22 and the risk evaluating module 23a perform an ECP simulation and a risk check using the data illustrated in FIG. 13, and fill the values of a deposition height ecp (nm), a single layer risk of short circuit or performance degradation F1 (nm), and a multilayer risk of short circuit or performance degradation F2 (nm), as illustrated in FIG. 14.

An error portion whose risk of short circuit or performance degradation is higher than a threshold is then detected (in FIG. 15, the portion of Lay, x, y=7, 500, 234), and for a mesh on which an error occurred, modification of a dummy metal disposition, simulation, and risk calculation are repeatedly performed to calculate the best multilayer risk of short circuit or performance degradation best and a dummy copper density Bdens and a dummy wiring boundary length Bedge with which the best multilayer risk of short circuit or performance degradation is obtained and fill the columns of these values.

By returning this data to the layout design apparatus 11a, a circuit layout is updated. In FIG. 17, the values of a dummy copper density Ddens, a dummy wiring boundary length Dedge, a deposition height ecp (nm), a single layer risk of short circuit or performance degradation F1 (nm), and a multilayer risk of short circuit or performance degradation F2 (nm) for the mesh of Lay, x, y=7, 500, 234, and the values of a single layer risk of short circuit or performance degradation F1 (nm) and a multilayer risk of short circuit or performance degradation F2 (nm) for the mesh of Lay, x, y=7, 500, 235 are updated.

As described above, in the LSI production system illustrated in the Second Embodiment, since the risk of short circuit or performance degradation is determined from variations in ECP deposition height and a disposition of a dummy metal is optimized, an effort to adjust a layout modification can be mitigated. Also, the number of times to extract data from a GDS is decreased.

Specifically, if a disposition of a dummy metal is modified 10 times on an area of 10% of a LSI chip, an amount of calculation time is 10 minutes×90% +(10 minutes×10%)× 10=19 minutes, plus another 2 hours to extract data, totaling 2 hours and 19 minutes.

On the other hand, if similar modification of a disposition of a dummy metal is performed using a CMP simulation, a whole surface of a chip needs to be simulated every time a disposition of a dummy metal is modified, because unlike in ECP, where an effect of modification of one mesh is contained within that mesh, modification of one mesh affects the entire chip in CMP. Therefore, if a disposition of a dummy metal is modified 10 times on an area of 10% of a chip, it takes 8 hours×a few thousand times or more for calculation.

As described above, the polish prediction and evaluation apparatus can predict and evaluate a result of the polishing process in a short time in the production of a semiconductor integrated circuit. Further more, the polish prediction and evaluation apparatus can enhance the speed of layout modification to increase the yield rate in a short time in the production of a semiconductor integrated circuit. Because the polish prediction and evaluation apparatus uses the simulation of the depositing process which processing time is short. Thus, the polish prediction and evaluation apparatus is useful for predicting and evaluating a polishing process, and particularly useful for supporting optimization of layout modification by enhancing the speed of evaluation.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method for evaluating a process of manufacturing a semiconductor integrated circuit including layers, each of the layers formed by a deposition step and a polishing step after the deposition step, the method comprising:
    dividing the semiconductor integrated circuit into a plurality of areas;
    determining a deposition height after the deposition step for each of the areas;
    determining a risk value of a single layer for each of the areas by calculating a difference in the deposition height between each of the areas of the single layer and its adjacent areas of the single layer; and
    determining a lamination risk value of the layers for each of the areas by calculating a difference of the risk values of each of the layers.

2. The method according to claim 1, further comprising outputting a warning when the difference between a predicted value of a deposition height of an area to be evaluated and predicted values of deposition heights of neighboring the areas is higher than a predetermined threshold value.

3. The method according to claim 1, wherein the deposition height determining calculates a deposition height of each of the areas after the polishing step is performed on the basis of a wiring density and a wiring boundary length.

4. The method according to claim 1, further comprising modifying a circuit layout on the basis of an evaluated result generated by the risk value determining.

5. The method according to claim 4, wherein the layout modifying disposes a dummy metal that changes physical characteristics against deposition without affecting electrical characteristics of a circuit on the circuit layout.

6. An apparatus for evaluating a process of manufacturing a semiconductor integrated circuit including layers, each of the layers formed by deposition step and a polishing step after the deposition step, the apparatus comprising:
    a memory for storing layout information of the semiconductor integrated circuit; and
    a processor for executing a process including
    dividing layout of the semiconductor integrated circuit into a plurality of areas;
    determining a deposition height after the deposition step for each of the areas;
    determining a risk value of a single layer for each of the areas by calculating a difference in the deposition height between each of the areas of the single layer and its adjacent areas of the single layer; and
    determining a lamination risk value of the layers for each of the areas by calculating a difference of the risk values of each of the layers.

* * * * *